United States Patent [19]
Eleyan et al.

[11] Patent Number: 6,111,455
[45] Date of Patent: Aug. 29, 2000

[54] METHOD FOR CONTROLLING DELAYS IN SILICON ON INSULATOR CIRCUITS

[75] Inventors: Nadeem Eleyan; Harsh Sharma, both of Austin, Tex.

[73] Assignee: International Business Machines Corporation, Armonk, N.Y.

[21] Appl. No.: 09/223,702

[22] Filed: Dec. 30, 1998

[51] Int. Cl.[7] .................................................... H03K 3/01
[52] U.S. Cl. .......................................... 327/537; 327/534
[58] Field of Search ................................... 327/534, 535, 327/537, 270, 276, 278, 281, 170, 134, 108, 111, 112

[56] References Cited

U.S. PATENT DOCUMENTS

| | | | |
|---|---|---|---|
| 5,461,338 | 10/1995 | Hirayama et al. | 327/534 |
| 5,814,899 | 9/1998 | Okumura et al. | 327/535 |
| 5,912,591 | 6/1999 | Yamada | 327/281 |
| 5,917,365 | 6/1999 | Houston | 327/534 |

OTHER PUBLICATIONS

Theodore Houston, "A Novel Dynamic VT Circuit Configuration," Proceedings 1997 IEEE International SOI Conference, Oct. 1997, pp. 154–155.

*Primary Examiner*—Toan Tran
*Attorney, Agent, or Firm*—Casimer K. Salys; Felsman, Bradley, Vaden, Gunter & Dillon, LLP

[57] ABSTRACT

A method for controlling delays in silicon on insulator circuits is disclosed. A semiconductor integrated circuit device comprises a first circuit and a second circuit. The first circuit includes multiple transistors, some of which have a floating body. In addition, the first circuit includes an input and an output. The second circuit is selectively coupled to a floating body of some of the transistors in the first circuit in order to control the delay of the output of the first circuit.

10 Claims, 3 Drawing Sheets

METHOD FOR CONTROLLING DELAYS IN SILICON ON INSULATOR CIRCUITS

BACKGROUND OF THE INVENTION

1. Technical Field

The present invention relates to semiconductor circuits in general, and in particular to silicon on insulator semiconductor circuits. Still more particularly, the present invention relates to a method for controlling delays in silicon on insulator circuits.

2. Description of the Prior Art

In recent years, the predominant processing technology for integrated circuits has been the Complementary Metal Oxide Silicon (CMOS) technology using silicon as substrates. Although CMOS technology offers various advantages, such as low power consumption and stability, over other types of processing technologies, there are also several drawbacks associated with CMOS circuits, such as relatively slow speed and potential latchup problem. In light of such, a new processing technology called Silicon on Insulator (SOI) technology has emerged. Instead of using an electrically conducting substrate like the CMOS technology, SOI utilizes an insulating substrate, which provides tremendous improvements in certain circuit characteristics, such as speed and latch-up, over the CMOS technology. A detailed description of the SOI technology can be found in Weste and Eshraghian, *Principles of CMOS VLSI Design: A Systems Perspective,* 2nd ed., pp. 125–130, Addison Wesley (1995), the pertinent portion of which is incorporated herein by reference.

Even with the SOI technology, there is still a need for providing controlled delays in certain critical timing areas of an integrated circuit. For example, some clock or data signals may need to be delayed before entering certain parts of the integrated circuit in order to improve the overall speed performance. In the prior art, there are several ways to produce a selectively controlled delay in such paths. This disclosure describes an improved method for providing controlled delays in SOI integrated circuits.

SUMMARY OF THE INVENTION

In accordance with a preferred embodiment of the present invention, a semiconductor integrated circuit device comprises a first circuit and a second circuit. The first circuit includes multiple transistors, some of which have a floating body. In addition, the first circuit includes an input and an output. The second circuit is selectively coupled to a floating body of some of the transistors in the first circuit in order to control the delay of the output of the first circuit.

All objects, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

With Silicon on Insulator (SOI) processing technology, each transistor (including both n-channel and p-channel transistors) within an integrated circuit is isolated from neighboring transistors as well as from the bulk of a silicon wafer. As a result, a floating silicon body is intrinsic to each transistor manufactured with the SOI processing technology. Generally, the floating silicon body of a transistor can be utilized as an additional input to the transistor and the potential of the floating silicon body will affect the overall delay through the conventional paths of the transistor. Thus, as a preferred embodiment of the present invention, the floating silicon body of a transistor is utilized to provide controlled delays in SOI integrated circuits.

The present invention will be illustrated by way of three different types of logic circuits commonly encountered in today's integrated circuit technology. These three different types of logic circuits are a static circuit, a dynamic circuit, and a transmission gate circuit. From these illustrations, a person skilled in the relevant art will be able to apply the principles as disclosed to any other type of logic circuit within an integrated circuit design.

A. Static Circuits

Figure 1:
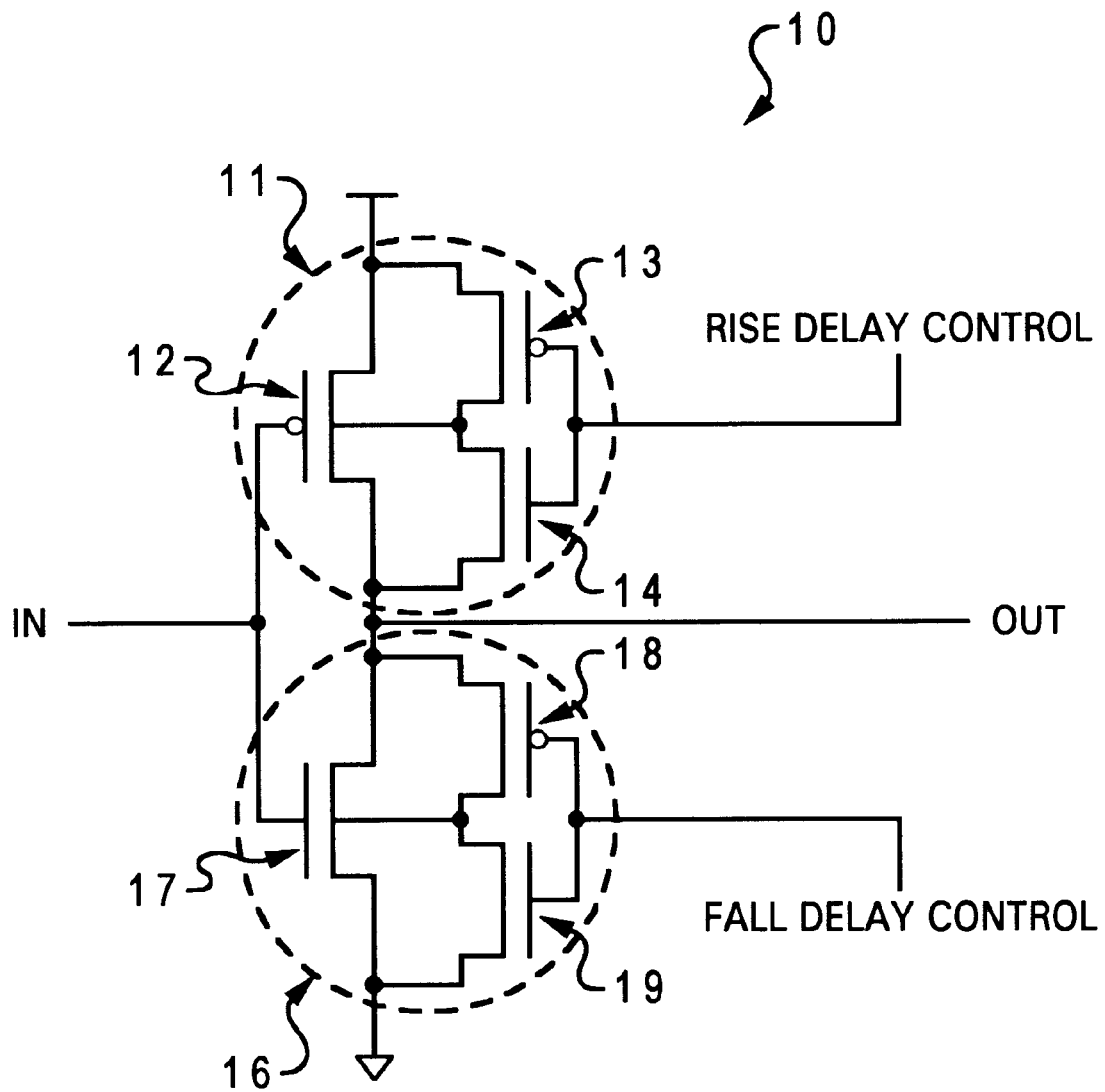
FIG. 1 is a circuit diagram of a static circuit in which a preferred embodiment of the present invention is incorporated.

Referring now to the drawings and in particular to FIG. 1, there is depicted a circuit diagram of a static circuit in which a preferred embodiment of the present invention is incorporated. Inverter 10, which is utilized to represent the entire class of static circuits, is a Complementary Metal Oxide Silicon (CMOS) invertor having its silicon on an insulator. As shown, inverter 10, having an input IN and an output OUT, includes a p-channel transistor 12 and an n-channel transistor 17. The operation of inverter 10 is well-understood by those skilled in the relevant art.

The body of transistor 12 is connected to the output of a pair of relatively small p-channel and n-channel transistors—transistors 13 and 14. The body of transistor 17 is similarly connected to the output of a pair of relatively small p-channel and n-channel transistors—transistors 18 and 19. Each of transistor pair 13, 14 and transistor pair 18, 19 is connected in an invertor configuration. Transistor pair 13, 14 controls the body potential of transistor 12, which in turn controls the rise delay of inverter 10. Similarly, transistor pair 18, 19 controls the body potential of transistor 17, which in turn controls the fall delay of inverter 10.

An input RISE DELAY CONTROL, connected to transistor pair 13, 14, controls the delay of a rising output of inverter 10. When the input RISE DELAY CONTROL is asserted, the rise delay of the output from invertor 10 is less than the normal rise delay when the input RISE DELAY CONTROL is not asserted. Contrarily, an input FALL DELAY CONTROL, connected to transistor pair 18, 19, controls the delay of a falling output of inverter 10. When the input FALL DELAY CONTROL is asserted, the fall delay of the output from invertor 10 is more than the normal fall delay when the input FALL DELAY CONTROL is not asserted. Both control input lines, i.e., RISE DELAY CONTROL and FALL DELAY CONTROL, can be utilized separately or in conjunction with each other. Incidentally, each of circuit 11 and circuit 16 can be utilized separately when only one of the output edges (rise or fall) needs to be controlled.

B. Dynamic Circuits

Figure 2:
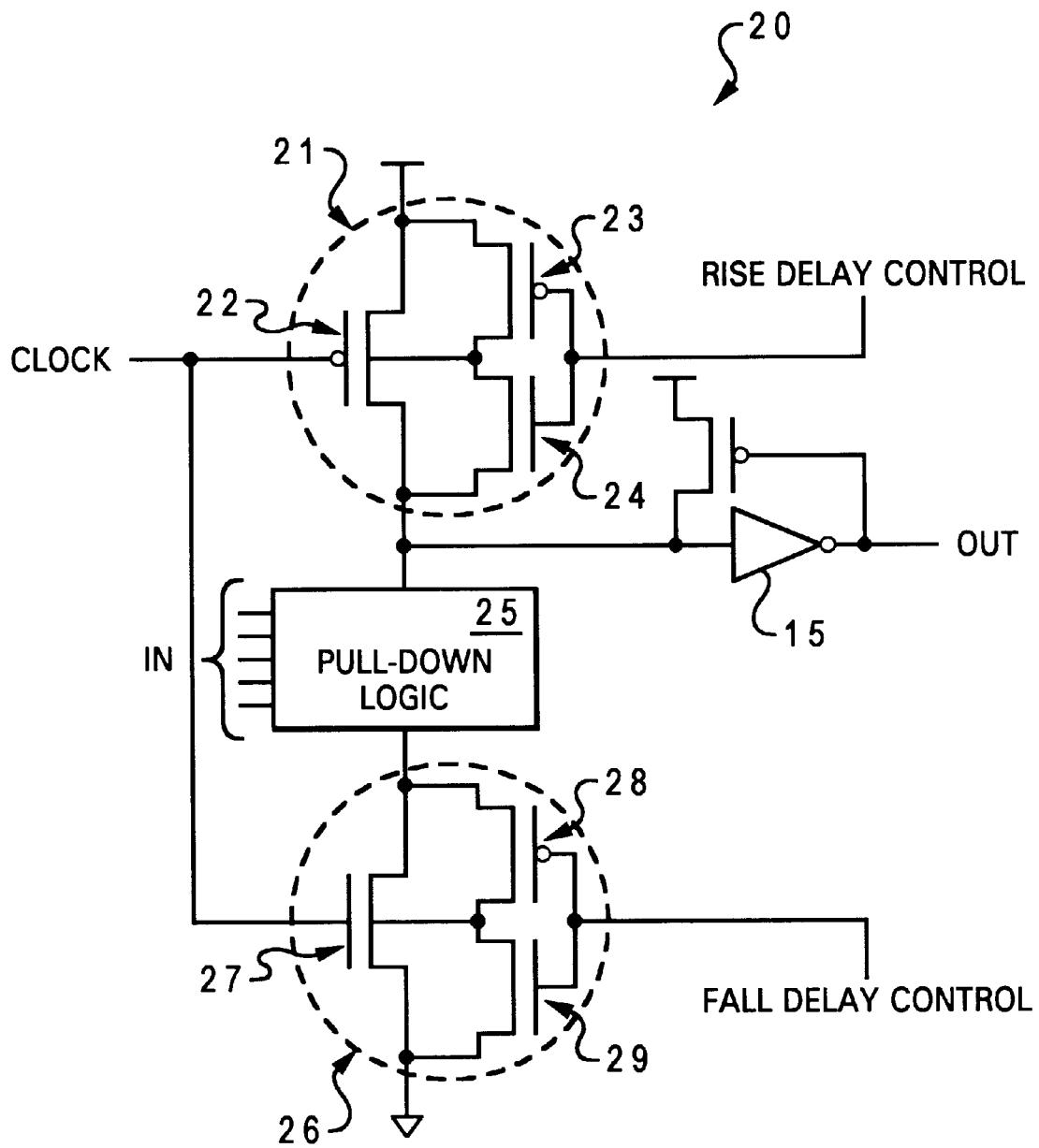
FIG. 2 is a circuit diagram of a dynamic circuit in which a preferred embodiment of the present invention is incorporated.

With reference now to FIG. 2, there is depicted a circuit diagram of a dynamic circuit in which a preferred embodiment of the present invention is incorporated. Dynamic circuit 20, which is utilized to represent the entire class of dynamic circuits, includes CMOS transistors having their silicon on an insulator. As shown, dynamic circuit 20, having inputs IN and an output OUT, includes a p-channel transistor 22, a pull-down logic block 25, an n-channel transistor 26, and an invertor 15 (which is coupled to a small p-channel transistor for output stabilization). Transistor 22 precharges circuit 20 when a CLOCK signal is low, and transistor 26 evaluates circuit 20 when the CLOCK signal is high. Pull-down logic block 25 represents a group of n-channel transistors that are required to implement a desired logic function. The operation of dynamic circuit 20 is well-understood by those skilled in the relevant art.

The body of transistor 22 is connected to the output of a pair of relatively small p-channel and n-channel transistors—transistors 23 and 24. The body of transistor 27 is similarly connected to the output of a pair of relatively small p-channel and n-channel transistors—transistors 28 and 29. Each of transistor pair 23, 24 and transistor pair 28, 29 is connected in an invertor configuration. Transistor pair 23, 24 controls the body potential of transistor 22, which in turn controls the rise delay of dynamic circuit 20. Similarly, transistor pair 28, 29 controls the body potential of transistor 27, which in turn controls the fall delay of dynamic circuit 20.

An input RISE DELAY CONTROL, connected to transistor pair 23, 24, controls the delay of a rising output of dynamic circuit 20. When the input RISE DELAY CONTROL is asserted, the rise delay of the output from dynamic circuit 20 is less than the normal rise delay when the input RISE DELAY CONTROL is not asserted. Contrarily, an input FALL DELAY CONTROL, connected to transistor pair 28, 29, controls the delay of a falling output of dynamic circuit 20. When the input FALL DELAY CONTROL is asserted, the fall delay of the output from dynamic circuit 20 is more than the normal fall delay when the input FALL DELAY CONTROL is not asserted. Both control input lines, i.e., RISE DELAY CONTROL and FALL DELAY CONTROL, can be utilized separately or in conjunction with each other. Incidentally, each of circuit 21 and circuit 26 can be utilized separately when only one of the output edges (rise or fall) needs to be controlled.

C. Transmission gates

Figure 3:
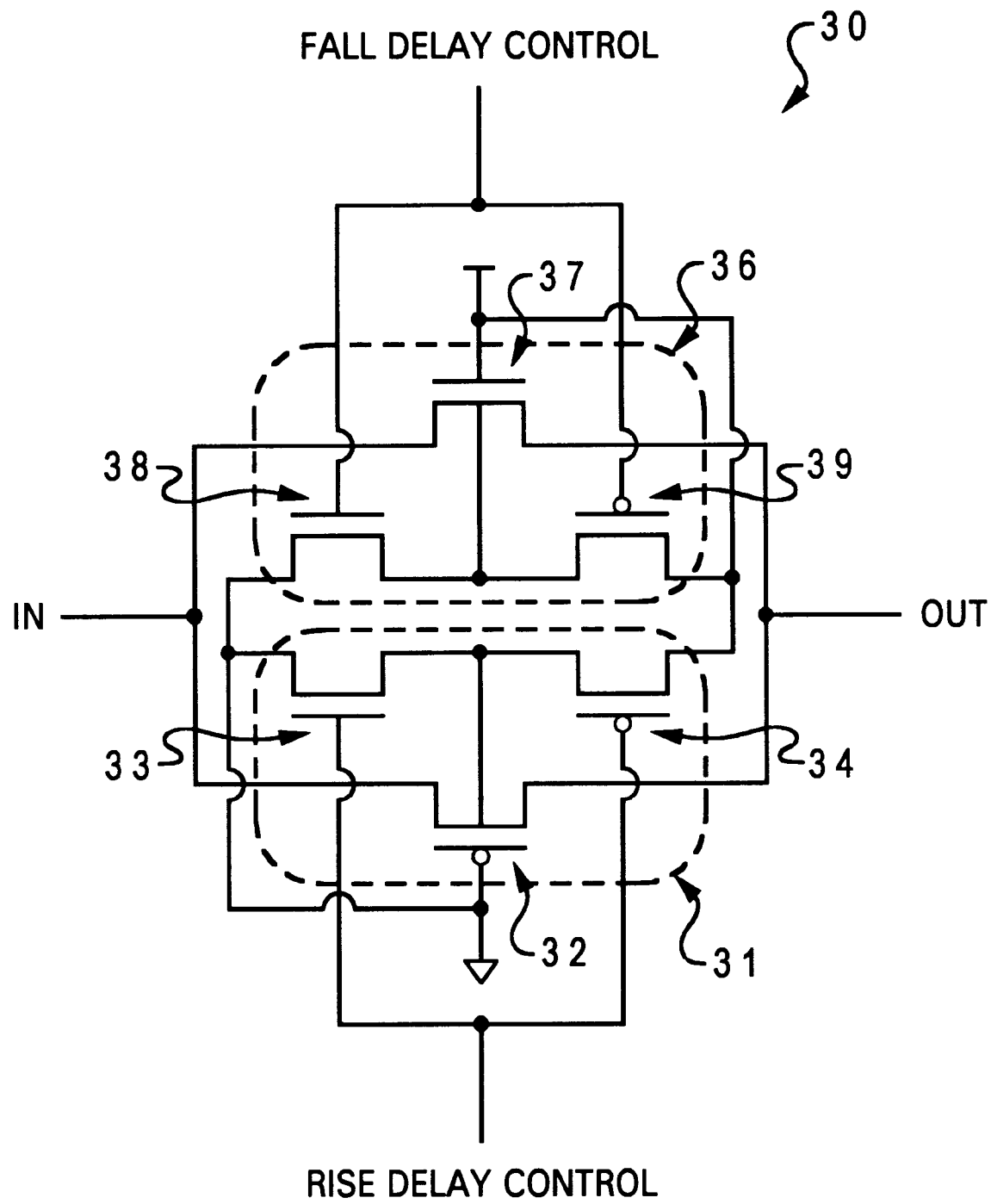
FIG. 3 is a circuit diagram of a transmission gate circuit in which a preferred embodiment of the present invention is incorporated.

Referring now to FIG. 3, there is depicted a circuit diagram of a transmission gate circuit in which a preferred embodiment of the present invention is incorporated. Transmission gate circuit 30, which is utilized to represent the entire class of transmission gate circuits, includes CMOS transistors having their silicon on an insulator. As shown, transmission gate circuit 30, having an input IN and an output OUT, includes a p-channel transistor 32 and an n-channel transistor 37. The gates of transistors 32 and 37 are connected to ground and $V_{dd}$, respectively, so that the gates of transistors 32 and 37 are conducting at all times. Transmission gate circuit 30 can be inserted between two circuits to produce a buffer with controlled delays. Transmission gate circuit 30 will not function as a regular transmission gate when the potentials of the gate of transistors 32 and 37 are reversed because the body potential on the two transistors will alter the transmission gate's conventional behavior. The functions of transmission gate circuit 30 are well-known to those skilled in the relevant art.

The body of transistor 32 is connected to the output of a pair of relatively small p-channel and n-channel transistors—transistors 33 and 34. On the other hand, the body of transistor 37 is connected to the output of a pair of relatively small p-channel and n-channel transistors—transistors 38 and 39. Each of transistor pair 33, 34 and transistor pair 38, 39 is connected in an invertor configuration. Transistor pair 33, 34 controls the body potential of transistor 32, which in turn controls the rise delay of transmission gate circuit 30. Similarly, transistor pair 38, 39 controls the body potential of transistor 37, which in turn controls the fall delay of transmission gate circuit 30.

An input RISE DELAY CONTROL, connected to transistor pair 33, 34, controls the delay of a rising output of transmission gate circuit 30. When the input RISE DELAY CONTROL is asserted, the rise delay of the output from transmission gate circuit 30 is less than the normal rise delay when the input RISE DELAY CONTROL is not asserted. Contrarily, an input FALL DELAY CONTROL, connected to transistor pair 38, 39, is utilized to control the delay of a falling output of transmission gate circuit 30. When the input FALL DELAY CONTROL is asserted, the fall delay of the output from transmission gate circuit 30 is more than the normal fall delay when the input FALL DELAY CONTROL is not asserted. Both control input lines, i.e., RISE DELAY CONTROL and FALL DELAY CONTROL, can be utilized separately or in conjunction with each other. Incidentally, each of circuit 31 and circuit 36 can be utilized separately when only one of the output edges (rise or fall) needs to be controlled.

As has been described, the present invention provides an improved method for controlling delays in CMOS circuit utilizing SOI processing technology. Although SOI processing technology is utilized throughout this disclosure to illustrate the present invention, it is understood by those skilled in the art that the principle taught herein may also be applicable to all processing technologies that have a floating semiconductor body.

While the invention has been particularly shown and described with reference to a preferred embodiment, it will be understood by those skilled in the art that various changes in form and detail may be made therein without departing from the spirit and scope of the invention.

What is claimed is:

1. A semiconductor integrated circuit device, comprising:
   a static circuit having a plurality of p-channel and n-channel transistors, each of said transistors has a floating body, wherein said static circuit includes an input and an output;
   a rise delay control circuit coupled to a floating body of said p-channel transistors in said static circuit for selectively controlling delays of a rising output signal at said output of said static circuit via a rise delay signal; and
   a fall delay control circuit coupled to a floating body of said n-channel transistors in said static circuit for selectively controlling delays of a falling output signal at said output of said static circuit via a fall delay signal; wherein each of said rise delay control circuit and said fall delay control circuit includes a transistor pair.

2. The semiconductor integrated circuit device according to claim 1, wherein said static circuit is manufactured with silicon on insulator processing technology.

3. The semiconductor integrated circuit device according to claim 1, wherein said transistor pair includes a p-channel and an n-channel transistor connected in an invertor configuration.

4. A semiconductor integrated circuit device, comprising:

a dynamic circuit having a precharge transistor and an isolation transistor, each of said transistors has a floating body and a gate connected to a clock signal, wherein said dynamic circuit includes a logic circuit connected in series between the precharge transistor and the isolation transistor; wherein the logic circuit has an output and at least one input;

a rise delay control circuit coupled only to a floating body of said precharge transistor in said dynamic circuit for selectively controlling delays of a rising output signal at said output of said dynamic circuit via a rise delay signal; and a fall delay control circuit coupled only to a floating body of said isolation transistor in said dynamic circuit for selectively controlling delays of a falling output signal at said output of said dynamic circuit via a fall delay signal; wherein each of said rise delay control circuit and said fall delay control circuit includes a transistor pair.

5. The semiconductor integrated circuit device according to claim 4, wherein said dynamic circuit is manufactured with silicon on insulator processing technology.

6. The semiconductor integrated circuit device according to claim 4, wherein said precharge transistor is a p-channel transistor and said isolation transistor is an n-channel transistor.

7. The semiconductor integrated circuit device according to claim 4, wherein said transistor pair includes a p-channel and an n-channel transistor connected in an invertor configuration.

8. A semiconductor integrated circuit device, comprising:

a transmission gate circuit having a p-channel transistor and an n-channel transistor connected in parallel, each of said transistors has a floating body, wherein said transmission gate circuit has an input and an output;

a rise delay control circuit coupled to a floating body of said p-channel transistor in said transmission gate circuit for selectively controlling delays of a rising output signal at said output of said transmission gate circuit via a rise delay signal; and a fall delay control circuit coupled to a floating body of said n-channel transistor in said transmission gate circuit for selectively controlling delays of a falling output signal at said output of said transmission gate circuit via a fall delay signal; wherein each of said rise delay control circuit and said fall delay control circuit includes a transistor pair.

9. The semiconductor integrated circuit device according to claim 8, wherein said transmission gate circuit is manufactured with silicon on insulator processing technology.

10. The semiconductor integrated circuit device according to claim 8, wherein said transistor pair includes a p-channel and an n-channel transistor connected in an invertor configuration.

\* \* \* \* \*